United States Patent
Xiao et al.

(10) Patent No.: US 12,557,270 B2
(45) Date of Patent: Feb. 17, 2026

(54) SEMICONDUCTOR STRUCTURE AND METHOD FOR MANUFACTURING THE SAME, MEMORY AND METHOD FOR MANUFACTURING THE SAME

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Deyuan Xiao, Hefei (CN); Yong Yu, Hefei (CN); Guangsu Shao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 682 days.

(21) Appl. No.: 17/872,117

(22) Filed: Jul. 25, 2022

(65) Prior Publication Data

US 2023/0301070 A1 Sep. 21, 2023

Related U.S. Application Data

(63) Continuation of application No. PCT/CN2022/084520, filed on Mar. 31, 2022.

(30) Foreign Application Priority Data

Mar. 17, 2022 (CN) .......................... 202210265812.3

(51) Int. Cl.
H10B 12/00 (2023.01)
H10D 30/01 (2025.01)
(Continued)

(52) U.S. Cl.
CPC ....... *H10B 12/395* (2023.02); *H10B 12/0383* (2023.02); *H10B 12/05* (2023.02);
(Continued)

(58) Field of Classification Search
CPC .. H10B 12/395; H10B 12/0383; H10B 12/05; H10B 12/053; H10B 12/31;
(Continued)

(56) References Cited

U.S. PATENT DOCUMENTS 5,874,760 A * 2/1999 Burns, Jr. .......... H10D 30/6891
257/E21.652
9,947,789 B1 4/2018 Suvarna
(Continued)

FOREIGN PATENT DOCUMENTS

CN 1574253 A 2/2005

OTHER PUBLICATIONS

CN first office action in application No. 202210265812.3, mailed on Aug. 14, 2025.

*Primary Examiner* — Britt D Hanley
*Assistant Examiner* — Victor V Barzykin
(74) *Attorney, Agent, or Firm* — Syncoda LLC; Feng Ma

(57) ABSTRACT

Provided are a semiconductor structure and a method for manufacturing the same, a memory device and a method for manufacturing the same. The semiconductor structure includes at least one transistor. Each of the at least one transistor includes a channel including a first semiconductor layer and a second semiconductor layer disposed around the first semiconductor layer. The second semiconductor layer introduces strain into the channel.

12 Claims, 8 Drawing Sheets

(51) Int. Cl.
  *H10D 30/63* (2025.01)
  *H10D 30/67* (2025.01)
  *H10D 30/69* (2025.01)
  *H10D 84/80* (2025.01)

(52) U.S. Cl.
  CPC ........... *H10D 30/025* (2025.01); *H10D 30/63* (2025.01); *H10D 30/751* (2025.01); *H10D 30/797* (2025.01); H10B 12/053 (2023.02); H10B 12/31 (2023.02); H10D 30/031 (2025.01); H10D 30/6704 (2025.01); H10D 30/798 (2025.01); H10D 84/80 (2025.01)

(58) Field of Classification Search
  CPC .... H10D 30/025; H10D 30/63; H10D 30/751; H10D 30/797; H10D 30/031; H10D 30/6704; H10D 30/798; H10D 84/80
  See application file for complete search history.

(56) References Cited

U.S. PATENT DOCUMENTS

| | | |
|---|---|---|
| 2020/0058798 A1 | 2/2020 | Pillarisetty et al. |
| 2020/0388698 A1 | 12/2020 | Veloso et al. |
| 2021/0242028 A1 | 8/2021 | Masuoka et al. |

* cited by examiner

SEMICONDUCTOR STRUCTURE AND METHOD FOR MANUFACTURING THE SAME, MEMORY AND METHOD FOR MANUFACTURING THE SAME

CROSS-REFERENCE TO RELATED APPLICATIONS

This application is a continuation of International Application No. PCT/CN2022/084520, filed on Mar. 31, 2022, which claims priority to Chinese Patent Application No. 202210265812.3, filed on Mar. 17, 2022. The contents of the aforementioned patent applications are hereby incorporated by reference in their entireties.

BACKGROUND

With the development trend of semiconductor devices to miniaturization, high density, and high integration, the size of memory devices continues to shrink. After the feature size of transistors in the semiconductor devices is reduced to the nanometer scale, the power consumption density, the mobility, and the like of transistors have reached the physical limits, which brings larger challenges to improve the performance of the transistors. In the related art, transistors are limited to the physical limits in terms of power consumption density and mobility, and it is difficult to reduce the power consumption and improve the speed of transistors etc.

SUMMARY

The present disclosure relates to the field of semiconductor technology, and relates to, but is not limited to, a semiconductor structure and a method for manufacturing the semiconductor structure, a memory device and a method for manufacturing the memory device.

Embodiments of the present disclosure provide a semiconductor structure including at least one transistor. Each of the at least one transistor includes a channel.

The channel includes a first semiconductor layer and a second semiconductor layer disposed around the first semiconductor layer. The second semiconductor layer introduces strain into the channel.

Embodiments of the present disclosure provide a method for manufacturing a semiconductor structure. The method includes that a channel is formed.

The channel includes a first semiconductor layer and a second semiconductor layer disposed around the first semiconductor layer. The second semiconductor layer introduces strain into the channel.

Embodiments of the present disclosure further provide a memory device. The memory device includes multiple memory cells, a transistor array and multiple bit lines.

The multiple memory cells are arranged in an array in a first direction and a second direction.

The transistor array includes multiple semiconductor structures mentioned in the above embodiments. For transistors in each row of the transistor array arranged in the first direction, gate electrodes of the transistors in the row are physically connected to each other, and the gate electrodes physically connected to each other form a word line. Each of the multiple memory cells is connected to a source electrode or a drain electrode of a respective transistor in the transistor array. Both the first direction and the second direction are perpendicular to an extension direction of the channel of the transistor.

The multiple bit lines are arranged in parallel and at intervals in the second direction. Each of the multiple bit lines is connected to source electrodes or drain electrodes of transistors in a respective line of the transistor array arranged in the second direction.

Embodiments of the present disclosure further provide a method for manufacturing a memory device, which includes the following operations.

Multiple memory cells arranged in an array in a first direction and a second direction are formed.

A transistor array is formed. The transistor array is manufactured by using the method for manufacturing the semiconductor structure mentioned in the above embodiments. For transistors in each row of the transistor array arranged in the first direction, gate electrodes of the transistors in the row are physically connected to each other, and the gate electrodes physically connected to each other form a word line. Each of the multiple memory cells is connected to a source electrode or a drain electrode of a respective transistor in the transistor array. Both the first direction and the second direction are perpendicular to an extension direction of the channel of the transistor.

Multiple bit lines arranged in parallel and at intervals in the second direction are formed. Each of the multiple bit lines is connected to source electrodes or drain electrodes of transistors in a respective line of the transistor array arranged in the second direction.

DESCRIPTION OF REFERENCE NUMERALS

Figure 1A:
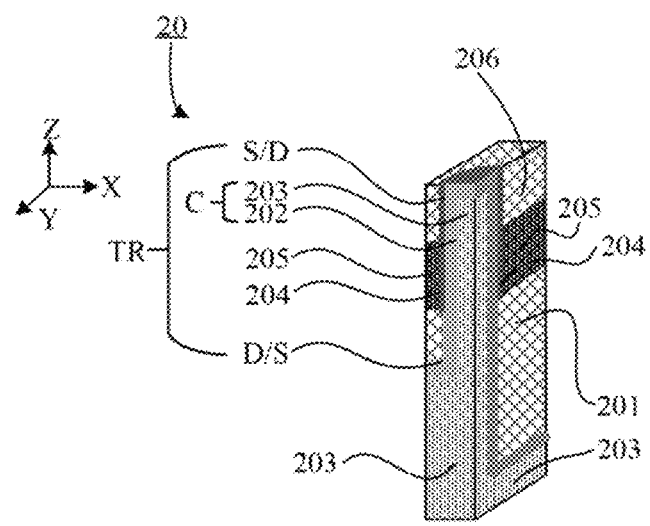
FIG. 1A is a three-dimensional diagram of a semiconductor structure according to an embodiment of the present disclosure.

20: semiconductor structure/transistor array; 100: substrate; 101: active layer; T1: first trench; T2: second trench; H1: first depth/first thickness: H2: second depth/second thickness; C: channel; 203: first semiconductor layer; 202: second semiconductor layer. 201: first dielectric layer; T3: third trench; H3: third depth/third thickness; 207: gate isolation structure: T4: fourth trench/fourth thickness; H4: fourth depth/fourth thickness; 204: gate oxide layer; 205: gate electrode; 206: second dielectric layer; S: source electrode; D: drain electrode; TR: transistor; 30: memory device; AT1/AT2: transistors in each row; BL: bit line; WL: word line.

DETAILED DESCRIPTION

Exemplary embodiments of the present disclosure will be described in more detail below with reference to the accompanying drawings. Although exemplary embodiments of the present disclosure are illustrated in the drawings, it should be understood that the present disclosure may be implemented in various forms and should not be limited by the specific embodiments set forth herein. Rather, these embodiments are provided to enable a more thorough understanding of the disclosure and to enable the full scope of the disclosure to be conveyed to those skilled in the art.

In the following description, a large number of specific details are given in order to provide a more thorough understanding of the present disclosure. However, it will be apparent to those skilled in the art that the present disclosure may be implemented without one or more of these details. In other embodiments, in order to avoid confusion with the present disclosure, some technical features known in the related art are not described. That is, not all features of the actual embodiment are described herein, and the known functions and structures are not described in detail.

In the drawings, the dimensions of layers, regions and elements and their relative dimensions may be exaggerated for clarity. Throughout the description, the same reference numerals denote the same elements.

It should be understood that spatial relationship terms such as "under", "below", "down", "above", "on", "over" and the like, can be used here for convenience of description, so as to describe the relationship between one element or feature and other elements or features shown in the figure. It should be appreciated that in addition to the orientations shown in the figure, the spatial relationship terms also intend to include different orientations of devices in use and operation. For example, if the device in the drawing is flipped, the element or feature described as "under" or "below" the other elements or features will be "on" the other elements or features. Therefore, the exemplary terms "below" and "under" may include upper and lower orientations. The device may additionally be oriented (being rotated through 90 degrees or other orientation) and the spatial relationship terms used herein are interpreted accordingly.

The terms used herein are intended only to describe specific embodiments and are not intended to be a limitation to the present disclosure. The expressions of singular form used herein such as "one", "a" and "the" are also intended to include the plural forms unless the context clearly indicates otherwise. It should also be understood that the terms "comprise" and/or "include" used in the description refer to the existence of the features, integers, steps, operations, elements and/or components, but do not exclude the existence or addition of one or more other features, integers, steps, operations, elements, components and/or groups. When used herein, the term "and/or" includes any and all combinations of the relevant listed items.

In order to understand the features and technical contents of the embodiments of the present disclosure in more detail, the implementation of the embodiments of the present disclosure will be described in detail below with reference to the drawings, which are for reference only and are not intended to limit the embodiments of the present disclosure.

Transistors can be used in various memory devices, such as dynamic random access memory (DRAM). Generally, DRAM is of the architecture including one transistor T and one capacitor C (1T1C).

As the size of the memory device shrinks, the size of the transistor in the storage region is also continuously shrinking. With the size of the transistor becoming smaller and smaller, the power consumption density and mobility of the transistor reach the physical limit. Specifically, for a transistor with a reduced size, such as a thin-film transistor (TFT), which has a carrier mobility $\mu$ (hereinafter denoted by the symbols $\mu$, $\mu_e$ and $\mu_h$. $\mu$ represents the carrier mobility, $\mu_e$ represents the electron mobility, and $\mu_h$ represents the hole mobility), when the feature size of the transistor is reduced to meet the design requirements, the $\mu$ is too low to meet the design requirements. In the related art, when the feature size of transistor is reduced, the transistor cannot have a high $\mu$; the power consumption cannot be reduced and the speed of transistor cannot be improved. It is thus difficult to improve the integration level and meet the requirements of high performance at the same time.

In order to solve at least one of the above-mentioned problems, embodiments of the present disclosure provide a semiconductor structure and a method for manufacturing the semiconductor structure, a memory device and a method for manufacturing the memory device.

Based on at least one of the above-mentioned problems existing in the related art, embodiments of the present disclosure provide a semiconductor structure and a method for manufacturing the semiconductor structure, a memory device and a method for manufacturing the memory device.

Embodiments of the present disclosure provide a semiconductor structure. FIG. 1A is a three-dimensional diagram of a semiconductor structure according to an embodiment of the present disclosure (it can be considered as a section view of a transistor in the semiconductor structure along the X-Z plane and the Y-Z plane, respectively). The semiconductor structure includes at least one transistor. The transistor 20 includes a channel C. The channel C includes a first semiconductor layer 203 and a second semiconductor layer 202 disposed around the first semiconductor layer 203. The second semiconductor layer 202 introduces strain into the channel C.

In some embodiments, the transistor TR further includes a gate electrode 205, a source electrode S and a drain electrode D. The gate electrode 205 covers at least one sidewall of the channel C. Each of the source electrode S and the drain electrode D is disposed on a respective end of an extension direction of the channel C.

It should be noted that the transistor according to the embodiments of the present disclosure may be a vertical transistor or a transistor with a buried gate electrode. In addition to the components of the transistor, FIG. 1A also illustrates the dielectric layers required for the buried gate electrode 205 (the first dielectric layer 201 and the second dielectric layer 206 as described below).

It will be appreciated that in embodiments of the present disclosure, the channel C includes the second semiconductor layer 202 introduced with the strain and the first semiconductor layer 203, so that the transistor TR can have a high $\mu$ that meets the requirements. When second semiconductor layer 202 with the strain is formed on the outer side of the first semiconductor layer 203, strain can be introduced into the second semiconductor layer 202. The introduced strain can improve the carrier mobility of the second semiconductor layer 202, thereby improving the $\mu$ of the channel C. Strain is introduced into the second semiconductor layer 202 of the channel C, which can elongate a distance between atoms in the semiconductor layer to reduce the number of atoms per unit length and reduce an amount of energy of carrier migration, thereby increasing the carrier mobility $\mu$ of the channel and increasing a current speed of the channel.

In practical application, strain can be introduced into the second semiconductor layer 202 by the selection of channel material and the selection of thin film deposition process to obtain the channel C with high $\mu$.

In some embodiments, when the material composition of the first semiconductor layer 203 is different from the material composition of the second semiconductor layer 202, a transition region with mismatched material composition is formed between the first semiconductor layer 203 and the second semiconductor layer 202. In this situation, strain is introduced into the transition region, which means that the first semiconductor layer 203 applies strain to the second semiconductor layer 202 through the transition region with mismatched material composition.

In some embodiments, a lattice constant of a first element contained in the first semiconductor layer 203 is different from a lattice constant of a second element contained in the second semiconductor layer 202.

As an example, a material of the first semiconductor layer 203 includes silicon germanium, and a material of the second semiconductor layer 202 includes silicon.

In some embodiments, during the process of depositing a thin film such as the first semiconductor layer 203 and the second semiconductor layer 202, strain may be introduced into the second semiconductor layer 202 by adjusting the deposition process parameter such as rate, temperature, pressure, and the like. In a specific embodiment, the parameter of the deposition process can be adjusted to adjust the density difference between the thin films, thereby introducing the strain (specific implementation details can be found in the description of FIG. 4D below).

In some embodiments, the gate electrode 205 is disposed around the channel C. That is, the vertical transistor in the embodiments of the present disclosure may specifically be a Gate-All-Around Transistor. It should be noted that the vertical transistor provided by the embodiment in the present disclosure is not limited to the Gate-All-Around Transistor, and may also be vertical transistors of other types, such as Gate-semi-Around transistor, column-shape gate transistor, and the like.

In practical application, the gate oxide layer 204 is formed between the gate electrode 205 and the channel C (i.e. between the gate electrode 205 and the second semiconductor layer 202).

In some embodiments, as illustrated in FIG. 1A, the positions of the source electrode S and the drain electrode D may be interchanged. The source electrode S is at a first end of the channel C, and the drain electrode D is at a second end of the channel C. Alternatively, the drain electrode D is at the first end of the channel C, and the source electrode S is at the second end of the channel C. The first end of the channel C and the second end of the channel C are opposite ends of the channel C in a third direction. Herein the third direction is the extension direction of the channel C.

Figure 1B:
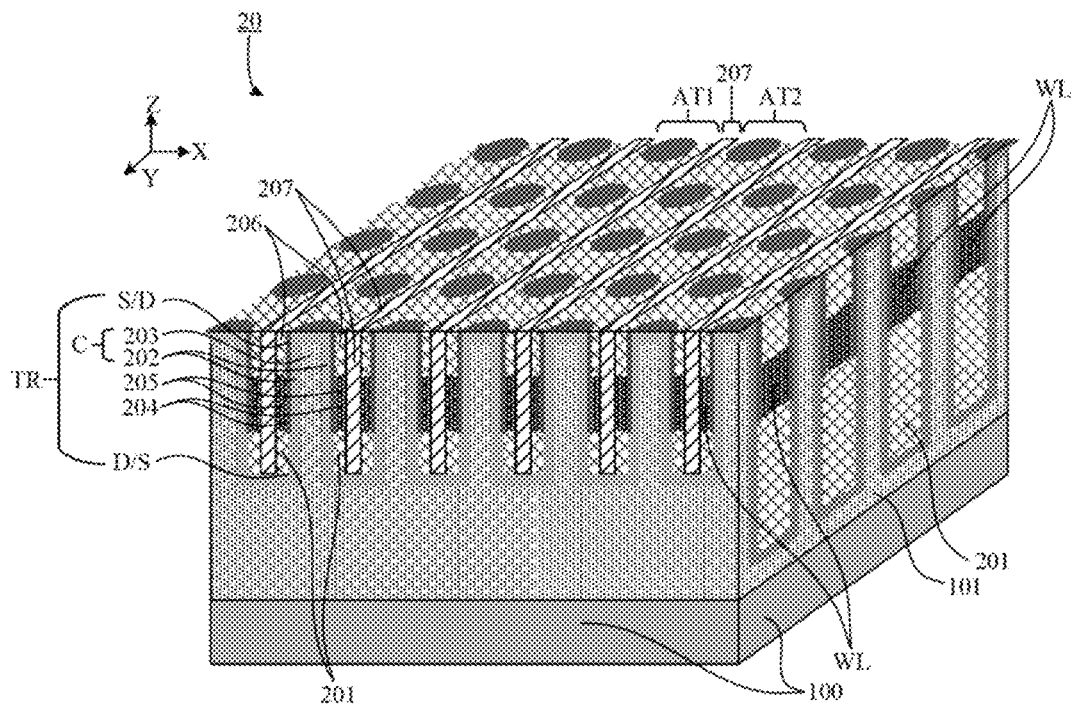
FIG. 1B is a three-dimensional diagram of another semiconductor structure according to an embodiment of the present disclosure.

Referring to FIG. 1B, in some embodiments, the semiconductor structure may include multiple transistors. Multiple channels C corresponding to the multiple transistors are arranged in an array in a first direction X and a second direction Y. Both the first direction X and the second direction Y are perpendicular to the extension direction of the multiple channels C.

For transistors in each row AT1/AT2 of the array arranged in the first direction, gate electrodes of the transistors in the row AT1/AT2 are physically connected to each other. For transistors in adjacent rows AT1 and AT2 of the array arranged in the first direction, gate electrodes of transistors in the row AT1 of the array are electrically isolated from gate electrodes of transistors in the row AT2 of the array.

In the practical application, FIG. 1B further illustrates the dielectric layers required for the buried gate electrode 205 (the first dielectric layer 201, the gate isolation structure 207 and the second dielectric layer 206 as described below). It should be understood that for transistors in each row AT1/AT2 of the array arranged in the first direction X, gate electrodes 205 of the transistors in the row AT1/AT2 are physically connected to each other. The gate electrodes physically connected to each other form a word line. The word line is a buried word line. For transistors in adjacent rows AT1 and AT2 of the array arranged in the first direction X, gate electrodes 205 of transistors in the row AT1 of the array are electrically isolated from gate electrodes 205 of transistors in the row AT2 of the array by the gate isolation structure 207. The gate electrodes 205 are isolated from other components in the third direction Z by the first dielectric layer 201 and the second dielectric layer 206.

In some embodiments, the first direction intersects the second direction, and the included angle between the first direction and the second direction can be any angle between 0 and 90 degrees. For example, the first direction may be perpendicular to the second direction. It can be understood that the included angle between the first direction and the second direction constructs the positional relationship of the array arrangement of the transistors along the first direction and the second direction.

Here and below, for the convenience of description, the first direction and the second direction in the embodiments of the present disclosure are perpendicular to each other and are parallel to the substrate plane, and the third direction is perpendicular to the substrate plane. That is, the third direction is the extension direction of the channel. The substrate plane can be considered as a plane perpendicular to the extension direction of the channel. In the drawings, the first direction can be the direction X; the second direction can be the direction Y, and the third direction can be the direction Z.

In some embodiments, the cross-section of the channel C, which is perpendicular to the third direction, can be of a circular, a rectangle, an oval or a diamond shape. In practical application, the shape of the cross-section can be determined according to the specific process. For example, a circular channel hole can be etched by patterning process, and the channel C is formed by deposition in the circular channel hole. The cross-section of the channel C, which is perpendicular to the third direction, is of a circular shape (i.e. the channel is of column shape). The channel C of the column shape can provide a stable structure for the subsequent formation of the transistor TR, thereby reducing defects and leakage of the transistor and improving the performance of the transistor.

In the embodiments of the present disclosure, the channel of each of the transistor includes a semiconductor layer of a double-layered structure, and the strain is introduced in the semiconductor layer of a double-layered structure. The introduced strain may elongate the distance between atoms in the semiconductor layer to reduce the number of atoms per unit length and reduce the amount of energy of carrier migration, so that a carrier mobility of the channel can be increased, thereby increasing a current speed of the channel, reducing power consumption of the transistor, increasing the speed of the transistor and the like. The transistor can thus have better performance. Meanwhile, in various embodiments of the present disclosure, the source electrode and the drain electrode of the transistor can be disposed in the extension direction of the transistor, so that the area occupied by a single transistor in the horizontal direction is reduced, and the number of transistors that can be arranged in a unit area is increased, which can meet the requirement of reducing the size of transistors.

The semiconductor structure according to the embodiment of the present disclosure may be obtained by the method for manufacturing the semiconductor structure according to the following embodiments. The semiconductor structure obtained by the manufacturing method according to the embodiment of the present disclosure is similar to the semiconductor structure described in the above embodiments. Technical features not disclosed in detail in the embodiments of the present disclosure can be understood with reference to the above embodiments, and will not be described herein.

Figure 2:
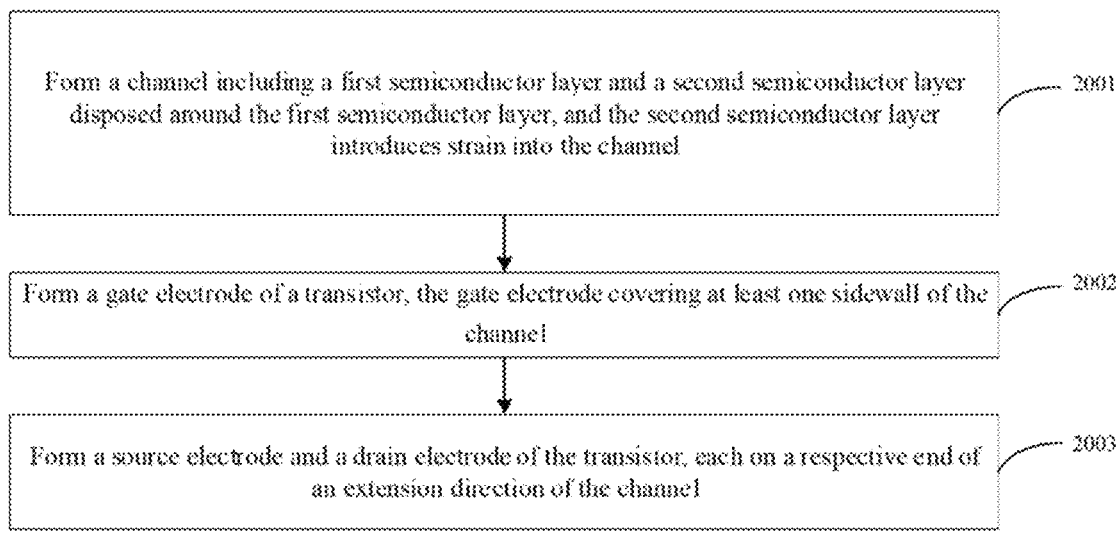
FIG. 2 is a flowchart of implementation of a method for manufacturing a semiconductor structure according to an embodiment of the present disclosure.

FIG. 2 is a flowchart of implementation of a method for manufacturing a semiconductor structure according to an embodiment of the present disclosure. FIGS. 3A to 3J are three-dimensional diagrams of a process of manufacturing the semiconductor structure according to embodiments of the present disclosure.

The method for manufacturing the semiconductor structure according to the embodiments of the present disclosure is described in detail below with respect to FIG. 2 and FIGS. 3A to 3J. It should be understood that the method for manufacturing the semiconductor structure described in the embodiments of the present disclosure is not limited to manufacture a specific number of transistors. The manufacturing method can be the method for manufacturing a single transistor or the method for manufacturing the transistor array. The following description and drawings illustrate the method for manufacturing the transistor army. FIGS. 3A to 3J are three-dimensional diagrams of the process of manufacturing the semiconductor structure according to embodiments of the present disclosure. It should be understood that the operations illustrated in FIGS. 3A to 3J are not exclusive, and other operations may be performed before, after, or between any of the illustrated operations. The execution order of the operations illustrated in FIGS. 3A to 3J can be adjusted according to actual requirements.

As illustrated in FIG. 2, the method for manufacturing the semiconductor structure includes the following operations.

At block 2001, a channel is formed. The channel includes a first semiconductor layer and a second semiconductor layer disposed around the first semiconductor layer. The second semiconductor layer introduces strain into the channel.

In some embodiments, the method further includes the following operations.

At block 2002, a gate electrode, covering at least one sidewall of the channel, of a transistor is formed.

At block 2003, a source electrode and a drain electrode of the transistor are formed, each on a respective end of an extension direction of the channel.

FIGS. 3A to 3D may be referred to for execution of block 2001. In some embodiments, the semiconductor structure includes multiple transistors, and each of the multiple transistors corresponds to a respective one of multiple channels. The multiple channels are formed, which includes the following operations.

An active layer 101 is provided.

The active layer 101 is partially etched to form multiple first trenches T1 extending in a first direction, multiple second trenches T1 extending in a second direction and multiple first semiconductor layers 203. Each of the multiple first semiconductor layers 203 is located at a junction of a respective one of the multiple first trenches T1 and a respective one of the multiple second trenches T2. Sidewalls of each of the multiple first semiconductor layers 203 are exposed in a respective one of the multiple first trenches T1 and a respective one of the multiple second trenches T2, and extend in a direction perpendicular to a surface of the active layer. The first direction and the second direction are parallel to the surface of the active layer.

The second semiconductor layer 202 is formed on sidewalls and top surfaces of the multiple first semiconductor layers 203.

Figure 3A:
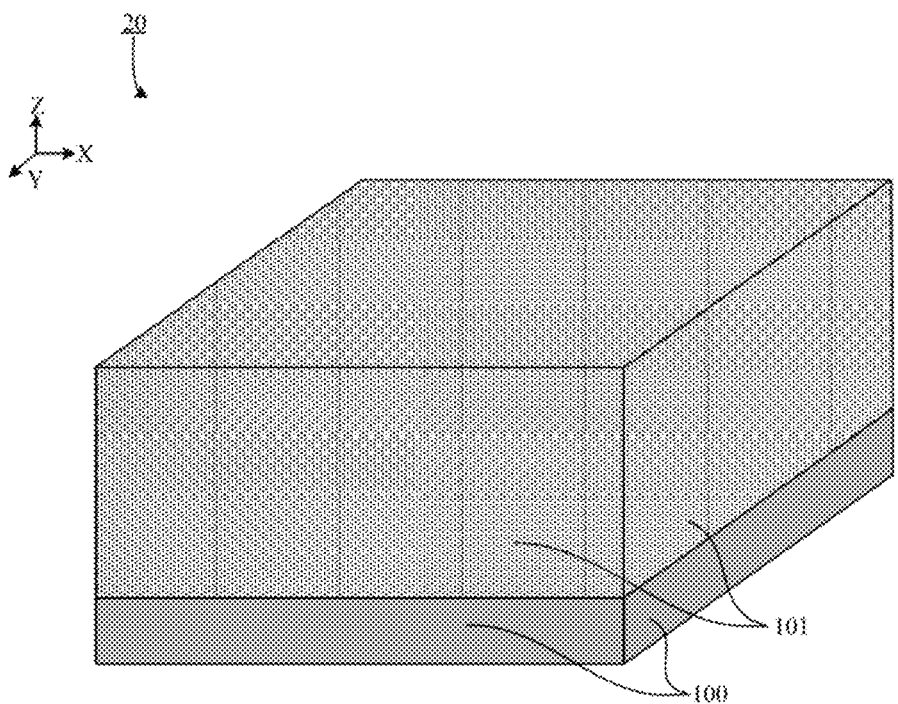
FIGS. 3A to 3J are three-dimensional diagrams of a process of manufacturing a semiconductor structure according to embodiments of the present disclosure.

As illustrated in FIG. 3A, the active layer 101 is provided. The material of the active layer 101 may include silicon (Si), germanium (Ge), silicon germanium (SiGe), and the like. The active layer 101 may be doped with certain impurity ions as required. The impurity ions may be N-type impurity ions or P-type impurity ions. In practical application, the active layer 101 may be formed by the physical vapor deposition (PVD) process, the chemical vapor deposition (CVD) process, the atomic layer deposition (ALD) process, or the like.

In some embodiments, the active layer 101 may be formed on the substrate 100 according to actual needs of the device. The material of the substrate 100 may include Si, Ge or SiGe etc. The substrate 100 may be silicon-on-insulator (SOI) or germanium-on-insulator (GOI). In other embodiments, the active layer 101 may also be formed on other functional thin film layers.

In some embodiments, the active layer 101 may be formed on the substrate 100 by epitaxial growth process (EGP). The material of the active layer 101 may include Si. The material of the active layer 101 may include SiGe. It should be noted that the material of the active layer 101 and the material of the first semiconductor layer 203 described below may be the same material in different forms. In other words, the first semiconductor layer 203 is formed of material of the active layer 101 after part of the material of the active layer 101 is removed.

The active layer 101 is partially etched to form the multiple first trenches T1 extending in the first direction, the multiple second trenches T1 extending in the second direction and the multiple first semiconductor layers 203. Each of the multiple first semiconductor layers 203 is located at the junction of a respective one of the multiple first trenches T1 and a respective one of the multiple second trenches T2. Sidewalls of each of the multiple first semiconductor layers 203 are exposed in a respective one of the multiple first trenches T1 and a respective one of the multiple second trenches T2, and extend in the direction perpendicular to the surface of the active layer. The first direction and the second direction are parallel to the surface of the active layer.

Figure 3B:
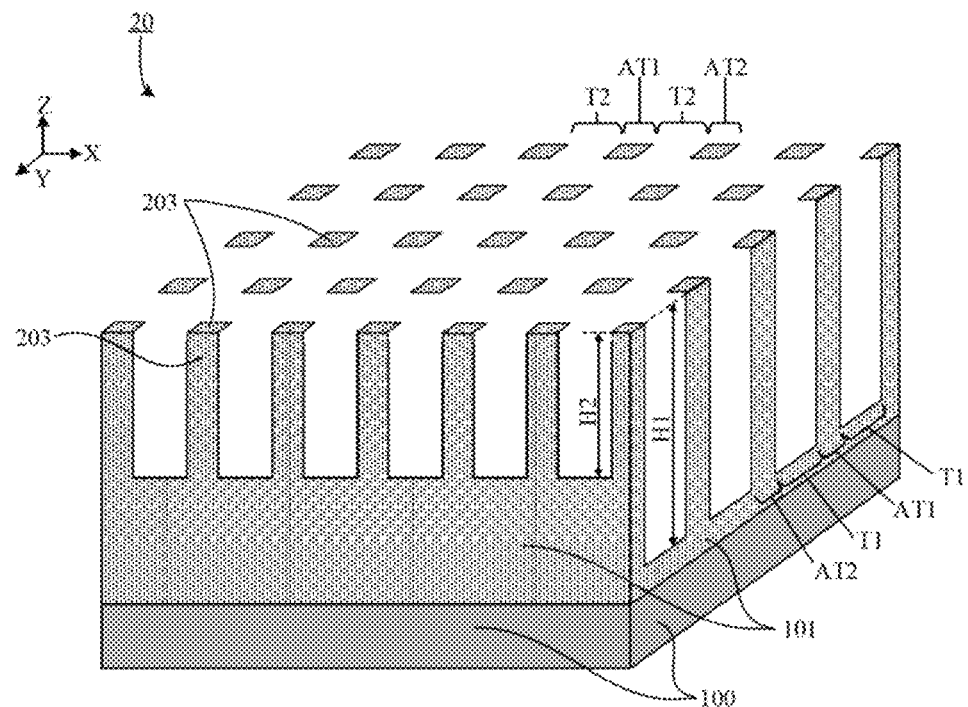

In practical application, the active layer 101 may be partially etched along the surface of the active layer by using the process of dry etching, such as ion milling etching, plasma etching, reactive ion etching, laser ablation, and the like. The multiple first trenches T1, which extend in the first direction and are arranged in parallel and at intervals in the second direction, are formed in the active layer 101. The multiple second trenches 12, which extend in the second direction and are arranged in parallel and at intervals in the first direction, are formed in the active layer 101. It should be noted that, as illustrated in FIG. 3B, each one of the multiple first trenches T1 can separate the multiple first semiconductor layers in adjacent rows arranged in the second direction (i.e. the first semiconductor layer AT1 and the first semiconductor layer AT2), and each one of the multiple second trenches T2 can separate the multiple first semiconductor layers in adjacent rows arranged in the first direction (i.e. the first semiconductor layer AT1 and the first semiconductor layer AT2). In the top-view plane (plane X-Y), the multiple first trenches T1 and the multiple second trenches T2 may divide the active layer into multiple first semiconductor layers 203 arranged in an array in the first direction and the second direction.

In some embodiments, the first trenches T1 and the second trenches T2 can be formed by one or more patterning processes. The one or more processes may include, but are not limited to, the double-patterning technology (DPT), the quadruple-patterning technology (QPT), the extreme ultra violet (EUV), or any combination of the DPT, the QPT and the EUV.

In some embodiments, the multiple first trenches T1 have a first depth H1 in the extension direction of the channel C. and the multiple second trenches T2 have a second depth T2 in the extension direction of the channel C. The first depth H1 is different from the second depth H2.

In practical application, as illustrated in FIG. 3B, the first depth H1 refers to the length from surface of the active layer 101 to the bottom of the multiple first trenches T1 in the third direction, and the second depth H2 refers to the length from surface of the active layer 101 to the bottom of the multiple second trenches T2 in the third direction. In the subsequent process, bit lines may be formed in the multiples first trenches T1, and word lines may be formed in the multiples second trenches T2. In this situation, the first depth H1 can be larger than the second depth H2. In other words, the multiple first layers 203 may have a first thickness H1 in the multiples first trenches T1 and have a second thickness H2 in the multiples second trenches T2, and the first thickness H1 can be larger than the second thickness H2.

It should be understood that when the first depth H1 of the multiples first trenches T1 is larger than the second depth H2 of the multiples second trenches T2, the bit lines BL can be formed in the multiples first trenches T1, and then the word lines can be formed in the multiples second trenches T2, such that the bit lines and the word lines may be staggered from each other in the third direction (the specific formation process is descried below in the relevant contents of buried bit line).

In practical application, the cross-section of each of the multiple first semiconductor layers 203 can be of one of a circular, an oval or a rectangle shape by using specific process. It should be noted that the cross-section is a top-view plane (plane X-Y).

Figure 3C:
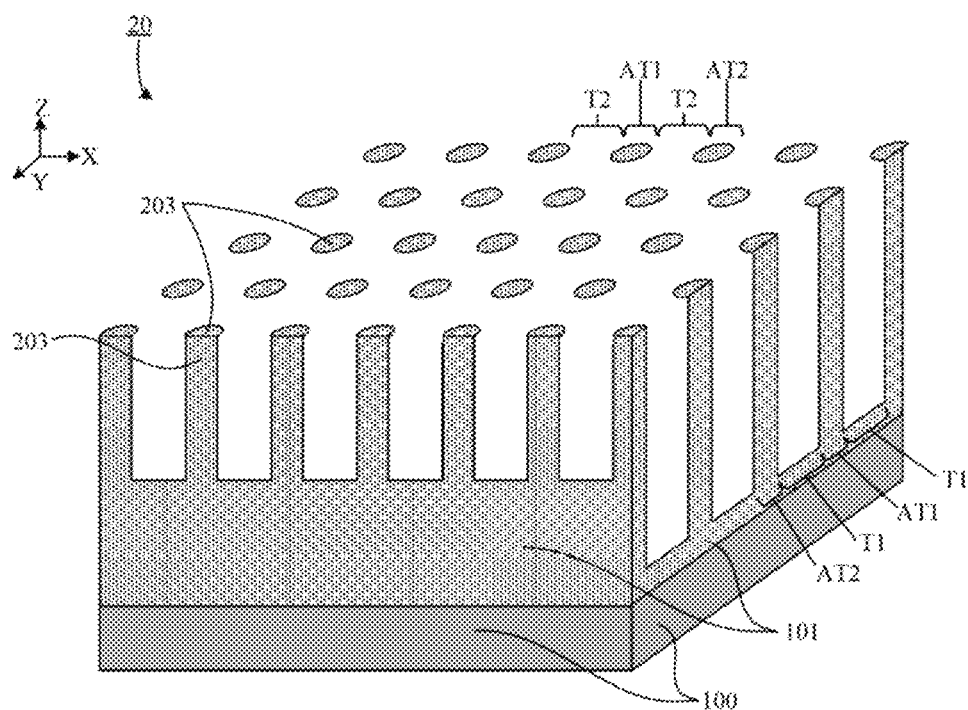

As illustrated in FIG. 3C, in some embodiments, the method further includes the following operations.

The first semiconductor layer 203 is formed in the active layer 101 to have a rectangular cross-section.

The rectangular cross-section of the first semiconductor layer 203 is changed into an oval cross-section by using an oxidation process.

In practical application, the active layer 101 may be partially etched along the surface of the active layer by using the process of dry etching, such as ion milling etching, plasma etching, reactive ion etching, laser ablation, and the like, so that the first semiconductor layer 203 is formed to have a rectangular cross-section as illustrated in the FIG. 3B. That is, the first semiconductor layer 203 is a cuboid. As illustrated in FIG. 3C, the first semiconductor layer 203 of the cuboid shape is passivated by the oxidation process to form the first semiconductor layer 203 of the column shape as illustrated in FIG. 3C. In this way, the size of the first semiconductor layer 203 can be further reduced to reduce the challenges to the existing process. Meanwhile, the first semiconductor layer 203 of the column shape can provide a stable structure for the subsequent formation of the transistor TR, thereby reducing defects and leakage of the transistor and improving the performance of the transistor.

Figure 3D:
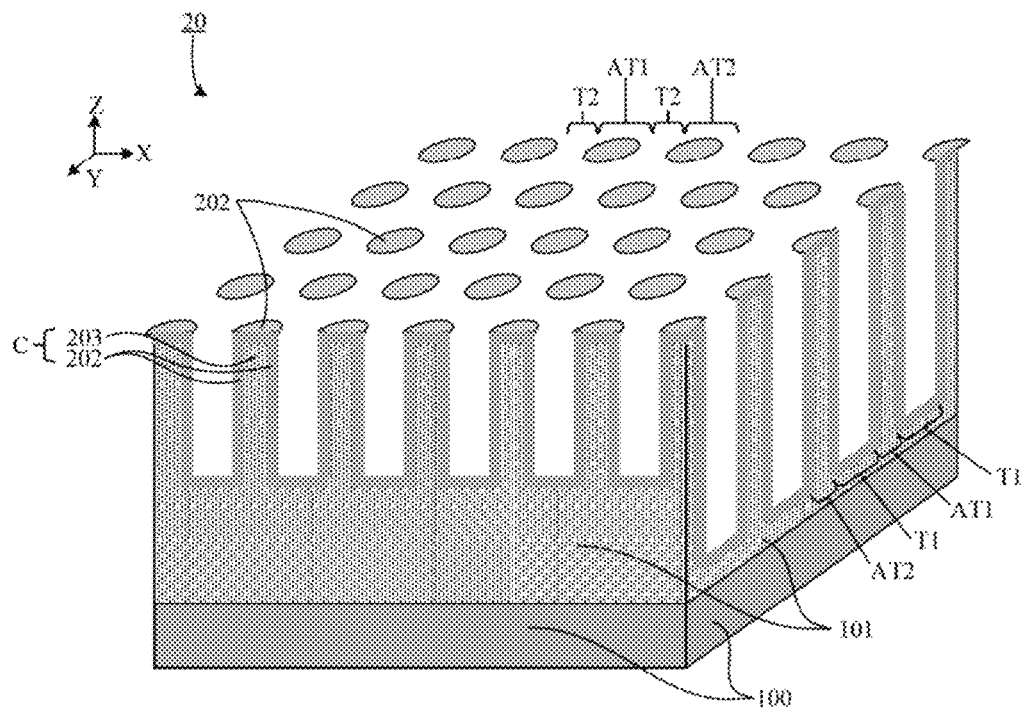

As illustrated in FIG. 3D, the second semiconductor layer 202 is formed on sidewalls and the top surface of the first semiconductor layer 203. The second semiconductor layer 202 can be formed by one or more deposition processes, which may include, but are not limited to, the PVD process, the CVD process, the ALD process, or any combination of the PVD process, the CVD process and the ALD process. For example, the second semiconductor layer 202 can be formed by the ALD process.

In some embodiments, the second semiconductor layer 202 may be formed on the first semiconductor layer 203 by the EGP. In practical application, when the material composition of the first semiconductor layer 203 is different from the material composition of the second semiconductor layer 202, the second semiconductor layer 202 is formed on the first semiconductor layer 203 by the EGP, and a transition region with mismatched material composition is formed between the first semiconductor layer 203 and the second semiconductor layer 202. In this situation, strain is introduced into the transition region, which means that the first semiconductor layer 203 applies strain to the second semiconductor layer 202 through the transition region with mismatched material composition.

In some embodiments, a lattice constant of a first element contained in the first semiconductor layer 203 is different from a lattice constant of a second element contained in the second semiconductor layer 202.

In some embodiments, the material of the first semiconductor layer 203 includes silicon germanium, and the material of the second semiconductor layer 202 includes silicon.

In practical application, the material of the second semiconductor layer 202 may include silicon, and the material of the first semiconductor layer 203 may include silicon germanium. Since the material of the second semiconductor layer 202 is different from the material of the first semiconductor layer 203, the second semiconductor layer 202 may be formed on the first semiconductor layer 203 by the EGP, the second semiconductor layer 202 can introduce the strain into the channel C. Specifically, since the lattice constant of germanium of the silicon germanium material in the first semiconductor layer 203 is larger than the lattice constant of silicon in the second semiconductor layer 202, the silicon germanium having the larger lattice constant applies strain to the silicon having the smaller lattice constant at the interface between the silicon germanium material and the silicon material. In other words, the second semiconductor layer 202 is subjected to the strain, which increase the electron mobility of the second semiconductor layer 202. Meanwhile, the silicon material surrounds the silicon germanium material, which can reduce the adverse effect of the instability of the germanium oxide on the channel. For example, germanium dioxide (GeO2) can be dissolved in water; solid of germanium oxide (GeO(s)) sublimes at 700° C. germanium and germanium dioxide in germanium decompose into solid or gas of germanium oxide at about 400° C., and the like. The unstable properties of germanium dioxide and germanium oxide may cause more defects in the channel material, which may increase the resistivity of the channel and affect the carrier mobility of the channel.

In some embodiments, the transistor TR is an N-type transistor and the strain is tensile strain. Alternatively, the transistor TR is a P-type transistor and the strain is compressive strain.

It should be understood that when the semiconductor layer 202 has the compressive/tensile strain and the first semiconductor layer 203 adjacent to the second semiconductor layer 202 in the direction perpendicular to the extension direction of the second semiconductor layer 202 has no strain, the first semiconductor layer 203 having no strain may be subjected to the compressive/tensile force applied by the second semiconductor layer 202 having the compressive/tensile strain, thereby introducing the compressive/tensile strain into the first semiconductor layer 203.

It should be understood that when the semiconductor layer 202 has no strain and the source electrode and/or the drain electrode has the compressive/tensile strain in the extension direction of the second semiconductor layer 202, the second semiconductor layer 202 having no strain may be subjected to the tensile/compressive force applied by the source electrode and/or the drain electrode having the compressive/tensile strain, thereby introducing the tensile/compressive strain into the first semiconductor layer 203.

Here, the tensile strain can make the length of the second semiconductor layer 202 tend to lengthen in the extension direction of the channel of the transistor TR, and the compressive strain can make the length of the second semiconductor layer 202 tend to shorten in the extension direction of the channel of the transistor TR. It should be understood that, taking the example that the material of the second semiconductor layer 202 includes silicon and the material of the first semiconductor layer 203 includes silicon germanium, when the transistor TR is an N-type transistor, the silicon germanium having the larger lattice constant applies tensile strain to the silicon having the smaller lattice constant at the interface between the silicon germanium material and the silicon material. In other words, the semiconductor layer 202 is subjected to the tensile strain, which increase the electron mobility $\mu_e$ of the N-type transistor. When the transistor TR is a P-type transistor, the material of the source electrode and/or the drain electrode includes silicon germanium; the material of the second semiconductor layer 202 includes silicon, and a transition region with mismatched material composition is formed between the source electrode and/or the drain electrode and the second semiconductor layer 202. In this situation, the strain is introduced into the transition region, which means that the source electrode and/or the drain electrode apply the strain to the second semiconductor layer 202 through the transition region with mismatched material composition. In other words, for a P-type transistor, the strain can be introduced into the second semiconductor layer 202 by the difference between the material of the source electrode and/or the drain electrode and the material of the second semiconductor layer 202, thereby increasing the hole mobility $\mu_h$ of the P-type transistor TR.

In other embodiments, during the process of depositing thin films such as the first semiconductor layer 203 and the second semiconductor layer 202, the strain may be introduced into the second semiconductor layer 202 by adjusting the deposition process parameter such as rate, temperature, pressure, and the like.

In a specific embodiment, the parameter of the deposition process can be adjusted to adjust the density difference between the films, thereby introducing the strain. For example, for the active layer 101 deposited by the conventional CVD process (the first semiconductor layer 203 is formed by etching the active layer 101 subsequently), when the second semiconductor layer 202 is formed on the first semiconductor layer 203 by using the plasma enhanced chemical vapor deposition (PECVD) process having a higher deposition rate and a lower temperature than the conventional CVD process, the second semiconductor layer 202 having a smaller density than the first semiconductor layer 203 can be obtained. In this situation, the second semiconductor layer 202 having the smaller relative density is subjected to a compressive force from the first semiconductor layer 203 having the larger relative density, thereby introducing the compressive strain into the second semiconductor layer 202. When the second semiconductor layer 202 is formed on the first semiconductor layer 203 by using the low pressure chemical vapor deposition (LPCVD) process having a lower deposition rate and a lower pressure than the conventional CVD process, the second semiconductor layer 202 having a larger density than the first semiconductor layer 203 can be obtained. The second semiconductor layer 202 having the larger relative density is subjected to a tensile force from the first semiconductor layer 203 having the smaller relative density, thereby introducing the tensile strain into the second semiconductor layer 202.

In other words, different parameters of the deposition process can be used for the first semiconductor layer and the second semiconductor layer, so that there is a density difference between the first semiconductor layer 203 and the second semiconductor layer 202. The interaction force is generated between the first semiconductor layer 203 and the second semiconductor layer 202, thereby introducing the strain into the second semiconductor layer 202. It should be noted that the strain can also be introduced into the first semiconductor layer 203 by introducing the strain into the second semiconductor layer 202 as described above.

As illustrated in FIGS. 3E to 3J, in some embodiments, after the channel C is formed, the method further includes the following operations.

The first trench T1 and the second trench T2 having the second semiconductor layer 202 are filled with a first dielectric layer 201.

The first dielectric layer 201 is partially etched to form a third trench T3. The third trench T3 is filled with an insulating material, to form a gate isolation structure 207.

The first dielectric layer 201 is partially etched, to form an exposed second semiconductor layer 202.

A gate oxide layer 204 is formed on the exposed second semiconductor layer 202.

First conductive material and a second dielectric layer 206 are sequentially filled. The first conductive material is used to form a gate electrode 205 of each of the multiple transistors.

Figure 3E:
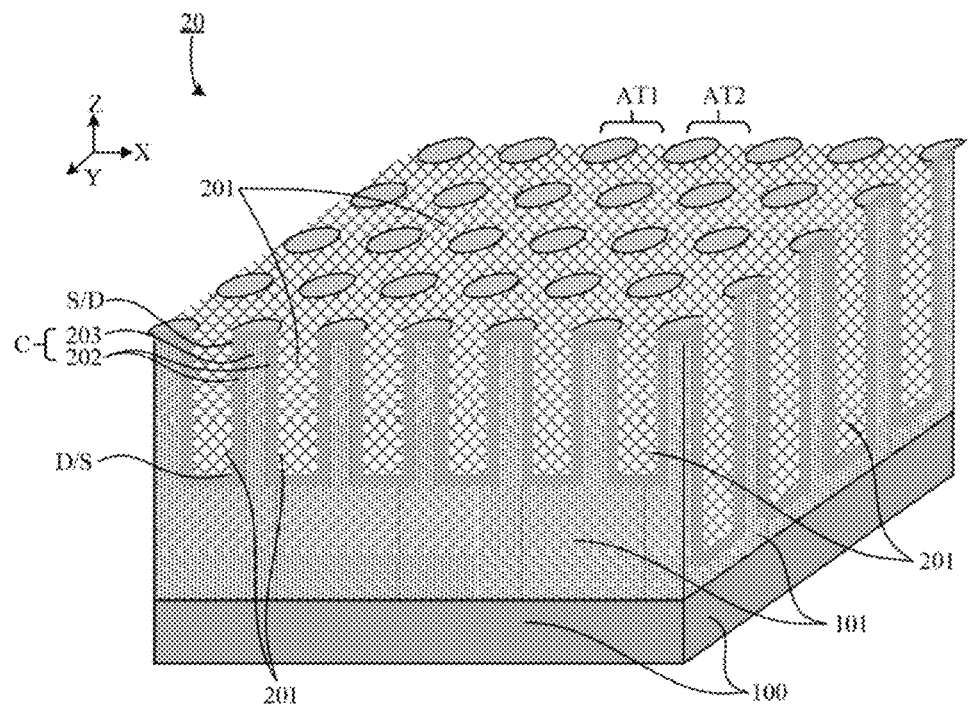

As illustrated in FIG. 3E, the first trench T1 and the second trench T2 having the second semiconductor layer 202 are filled with the first dielectric layer 201. The insulating material can be deposited in the first trench T1 and the second trench T2 by using the PVD process or the CVD process. The insulating material may be subjected to a Chemical Mechanical Polishing (CMP) treatment such that a surface of the insulating material is flush with a top surface of the channel C. In the embodiments of the present disclosure, the insulating material includes, but is not limited to, silicon nitride, silicon oxynitride, silicon carbide, silicon dioxide, or any combination of silicon nitride, silicon oxynitride, silicon carbide and silicon dioxide etc.

Figure 3F:
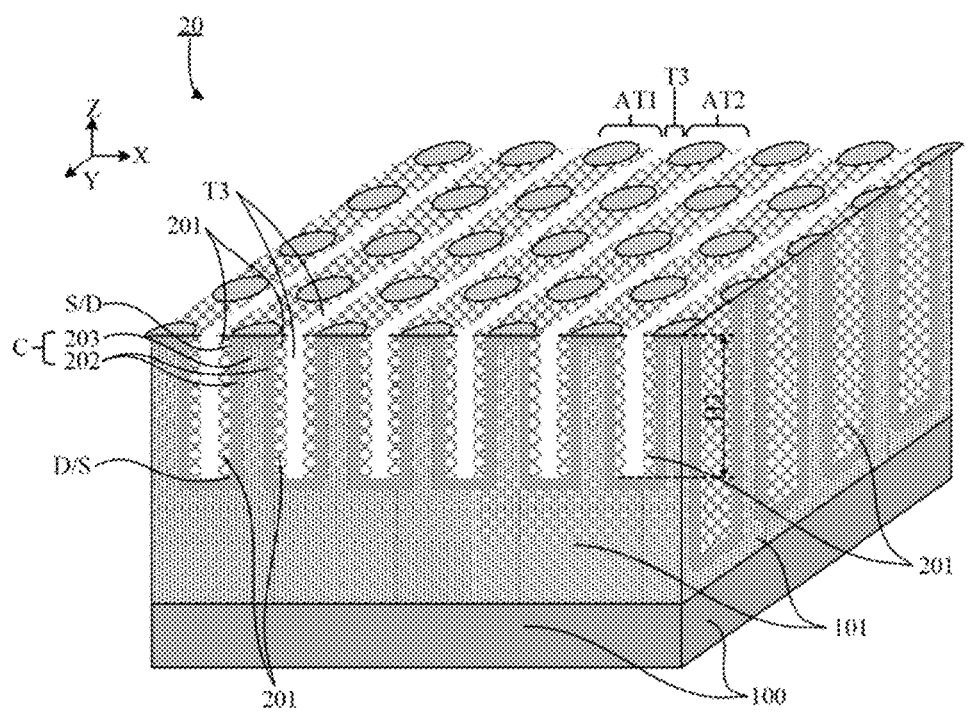

As illustrated in FIG. 3F, the first dielectric layer 201 is partially etched to form the third trenches T3. The width of the third trenches T3 (the width of the third trenches T3 may be considered as the dimension in the direction X) is smaller than the width of the first trench T1 (the width of the first trench T1 may be considered as the dimension in the direction X). In practical application, the third trenches T3 may be formed by using the process of dry etching, such as ion milling etching, plasma etching, reactive ion etching, laser ablation, and the like. The third trenches T3 have a third depth H3 in the third direction, and the third depth H3 is equal to the second depth H2 (as illustrated in FIG. 3B). The third trenches T3 extend in the second direction and are arranged in parallel and at intervals in the first direction. The third trenches T3 may divide the first dielectric layer 201 into multiple first dielectric layers 201 extending in the second direction and arranged in parallel and at intervals in the first direction.

Figure 3G:
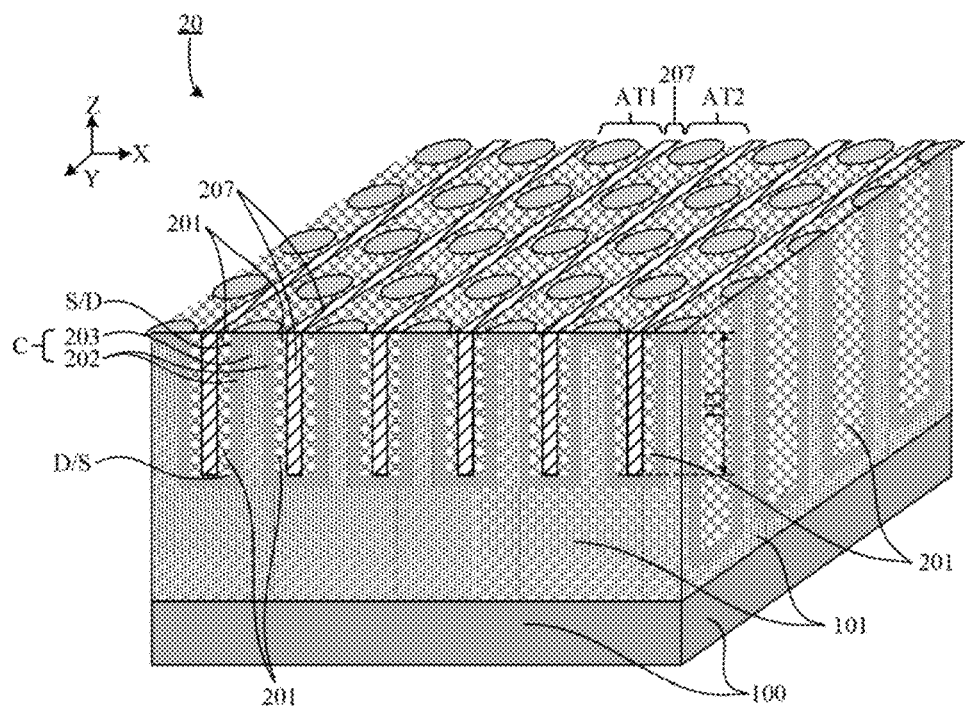

As illustrated in FIG. 3G, the third trenches T3 are filled with the insulating material, to form the gate isolation structure 207. In practical application, the insulating material can be deposited in the third trenches 13 by using the PVD process or the CVD process. The insulating material may be subjected to a CMP treatment such that a surface of the insulating material is flush with the surface of the first dielectric layer 201 and the gate isolation structure 207 is formed. In embodiments of the present disclosure, the insulating material includes, but is not limited to, silicon nitride, silicon oxynitride, silicon carbide, silicon dioxide, or any combination of silicon nitride, silicon oxynitride, silicon carbide and silicon dioxide etc.

In some embodiments, the thickness of the gate isolation structure 207 in the third direction is equal to the thickness of the channel C in the third direction. As illustrated in the FIG. 3F, the gate isolation structure 207 has the third thickness 113 in the third direction, and the third thickness H3 is equal to the second thickness H2 (as illustrated in the FIG. 3B).

Figure 3H:
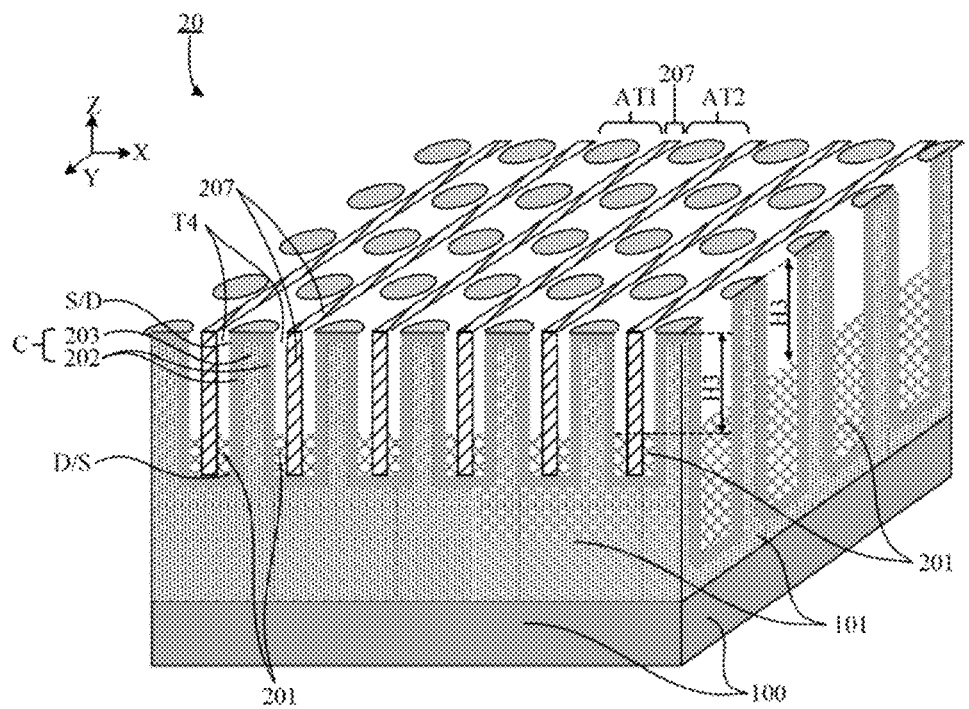

As illustrated in the FIG. 3H, the first dielectric layer 201 is partially etched to form the exposed second semiconductor layer 202. In practical application, the fourth trench T4, in which sidewalls of the second semiconductor layer 202 is exposed, is formed by using the process of dry etching, such as ion milling etching, plasma etching, reactive ion etching, laser ablation, and the like.

In some embodiments, the fourth trench T4 does not penetrate the first dielectric layer 201 in the third direction. The fourth trench T4 have a fourth depth H4 in the third direction, and the fourth depth H4 is smaller than the second thickness H2 (as illustrated above in FIG. 3B).

Figure 3I:
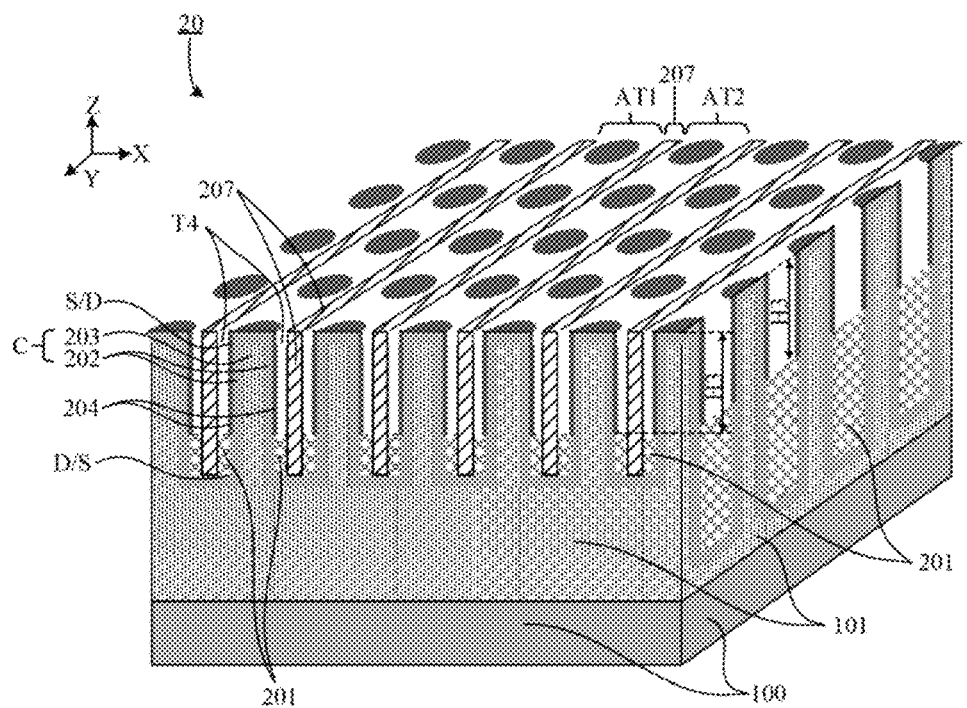

As illustrated in FIG. 3I, the gate oxide layer 204 is formed on the exposed second semiconductor layer 202. The gate oxide layer 204 can be formed in exposed sidewalls of the multiple channels C (i.e. exposed sidewalls of the multiple second semiconductor layers 202) by in-situ oxidation of the exposed sidewall of the second semiconductor layer 202 in the corresponding fourth trench T4. Here, exposed sidewalls of the multiple channels C (i.e. exposed sidewalls of the multiple second semiconductor layers 202) may be oxidized in situ by heating or exerting pressure to form the gate oxide layer 204. The material of the gate oxide layer 204 includes, but is not limited to, silicon dioxide.

In some embodiments, the gate oxide layer 204 can also be formed at exposed sidewalls of the multiple channels C (i.e. exposed sidewalls of the multiple second semiconductor layers 202) by using the ALD process.

In some embodiments, the gate oxide layer 204 is disposed around the channel C. In practical application, the gate oxide layer 204 is formed on the channel C. In other words, the gate oxide layer 204 is formed around the second semiconductor layer 202.

Figure 3J:
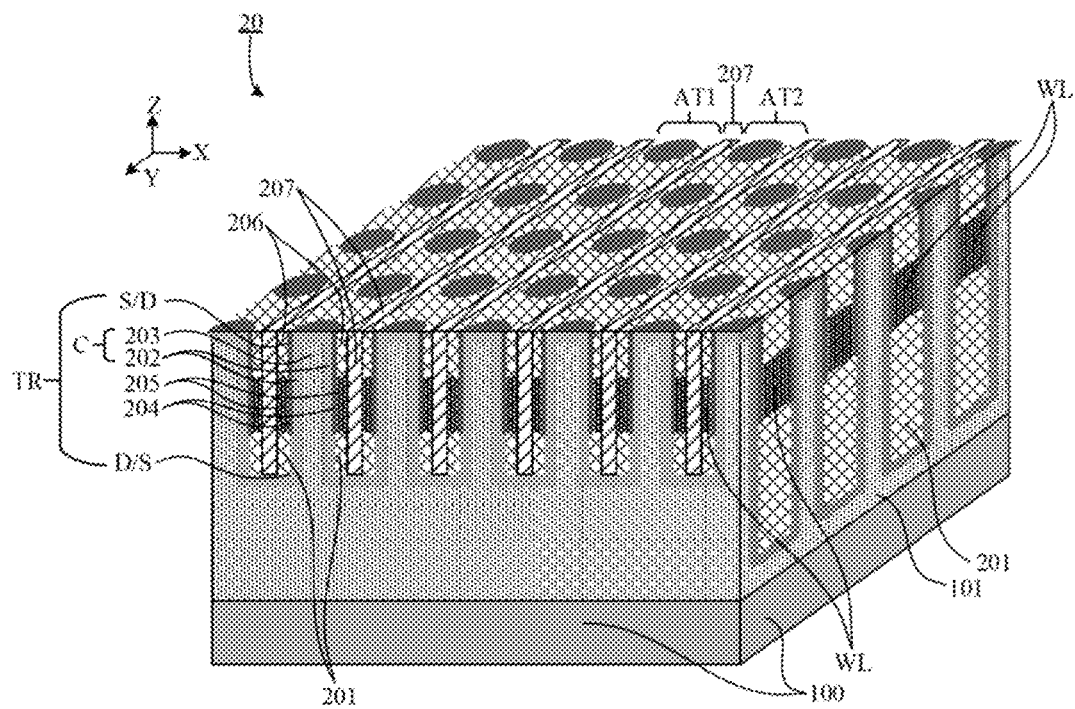

As illustrated in FIG. 3J, the first conductive material and the second dielectric layer 206 can be sequentially filled. The first conductive material can be used to form the gate electrode 205 of each of the multiple transistors. The first conductive material can be deposited in the fourth trench T4 by using the PVD process or the CVD process, and the fourth trench T4 having the gate oxide layer 204 and the first conductive material can be formed by using the etch back process. The second dielectric layer 206 can be deposited in the fourth trench T4 having the gate oxide layer 204 and the first conductive material.

In the embodiments of the present disclosure, the first conductive material may be metal material or semiconductor conductive material, such as copper, cobalt, tungsten, doped silicon, polysilicon, or any combination of copper, cobalt, tungsten, doped silicon and polysilicon. The material of the second dielectric layer 206 includes, but is not limited to, silicon nitride, silicon oxynitride, silicon carbide, silicon dioxide, or any combination of silicon nitride, silicon oxynitride, silicon carbide and silicon dioxide.

In some embodiments, the method further includes the following operations.

The gate electrode 205 of the transistor TR is formed. The gate electrode 205 covers at least one sidewall of the channel C.

The source electrode S and the drain electrode D of the transistor TR are formed, each on a respective end of the extension direction of the channel C.

Here, the formed semiconductor structure includes multiple transistors. Multiple channels C corresponding to the multiple transistors are arranged in an array in a first direction X and a second direction Y. Both the first direction X and the second direction Y are perpendicular to the extension direction of the multiple channels C.

For transistors in each row AT1/AT2 of the array arranged in the first direction, gate electrodes of the transistors in the row AT1/AT2 are physically connected to each other. For transistors in adjacent rows of the array arranged in the first direction, gate electrodes of transistors in the row AT1 of the array are electrically isolated from gate electrodes of transistors in the row AT2 of the array AT2.

It can be understood that the method for manufacturing the transistor array described in the embodiments of the present disclosure is not limited to manufacture a specific number of transistors. The manufacturing method can also be the method for manufacturing a single transistor. The method for manufacturing the transistor array (as illustrated above in FIG. 1B) in the embodiments of the present disclosure can be understood with reference to the operations described above in FIGS. 3A to 3J, which will not be repeated here.

It should be understood that in the process of manufacturing a single transistor with reference to the operations described in FIGS. 3A to 3J, some operations may not be necessary. For example, the operations of forming the gate isolation structure 207 illustrated in FIGS. 3I to 3J are not necessary. The method for manufacturing the single transistor (as illustrated above in FIG. 1A) according to the embodiments of the present disclosure can be understood with reference to the operations illustrated in FIGS. 3A to 3H, which will not be repeated here.

In some embodiments, as illustrated in FIG. 3A, FIG. 3C and FIG. 3D, the channel is formed, which includes the following operations.

An active layer 101 is provided. Specific details can be found in the description of FIG. 3A, and will not be repeated here.

The active layer 101 is partially etched to form a first semiconductor layer 203 having a column shape. The first semiconductor layer 203 extends in a direction perpendicular to a surface of the active layer. A grid mask pattern can be formed in the active layer 101 by using one or more patterning processes to have multiple openings arranged in array in the first direction and the second direction. The multiple openings are etched to have a single first semiconductor layer 203. The one or more patterning processes include, but are not limited to, DPT. QPT. EUV or any combination of the DPT, QPT and EUV. It can be understood that the first trench T1 and the second trench T2 can be formed synchronously in the same patterning process, and the first trench T1 has a first depth H1 in the extension direction of the channel C and the second trench T2 has a second depth H2 in the extension direction of the channel C. The first depth H1 can be different from the second depth H2.

The second semiconductor layer 202 is formed on sidewalls and a top surface of the first semiconductor layer 203. Specific details can be found in the description about forming the second semiconductor layer 202 in FIG. 3C and FIG. 3D, and will not be repeated here.

Figure 4:
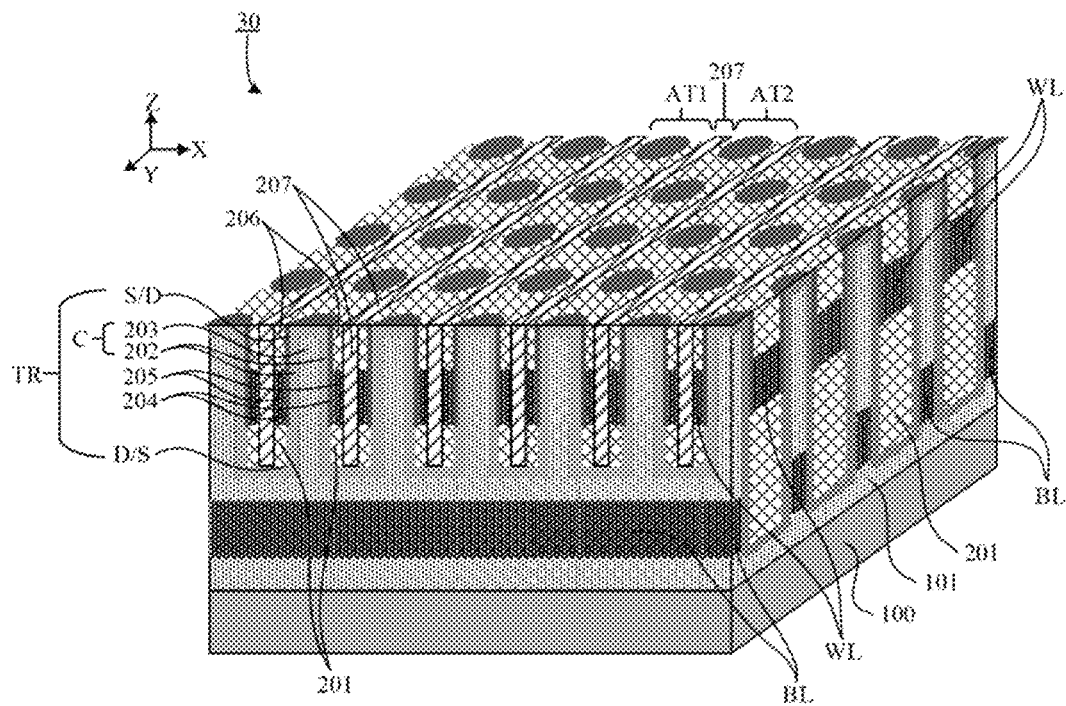
FIG. 4 is a three-dimensional diagram of a memory device according to an embodiment of the present disclosure.

Embodiments of the present disclosure provide a memory device. FIG. 4 is a three-dimensional diagram of a memory device according to an embodiment of the present disclosure.

As illustrated in FIG. 4, in some embodiments, the memory device 30 includes multiple memory cells (not shown in FIG. 4), a transistor array 20 and multiple bit lines.

The multiple memory cells are arranged in an array in a first direction and a second direction.

The transistor array 20 includes multiple semiconductor structures according to the embodiments of the present disclosure. For transistors in each row AT1/AT2 of the transistor array 20 arranged in the first direction, gate electrodes of the transistors in the row AT1/AT2 are physically connected to each other. The gate electrodes 205 physically connected to each other form a word line. Each of the multiple memory cells is connected to a source electrode S or a drain electrode D of a respective transistor in the transistor array 20. Both the first direction and the second direction are perpendicular to an extension direction of the channel C of the transistor.

The multiple bit lines BL are arranged in parallel and at intervals in the second direction. Each of the multiple bit lines BL is connected to source electrodes or drain electrodes of transistors in a respective line of the transistor array 20 arranged in the second direction.

In practical application, gate electrodes 205 of the transistors in each row of the transistor array 20 are connected with a respective one of multiple word lines. Each of the multiple word lines is used to supply a word line voltage, and the turn-on or turn-off of the channel region in each of the transistors is controlled by the word line voltage. Each of the multiple bit lines extending in the first direction X is connected to the drain electrodes of transistors in a respective line of the transistor array 20. The multiple bit lines are used to perform a read or write on the multiple memory cells when each of the transistors is turned on.

In the embodiments of the present disclosure, the materials of the multiple word lines and the bit lines may include, but are not limited to, tungsten, cobalt, copper, aluminum, polysilicon, doped silicon, silicide, or any combination of tungsten, cobalt, copper, aluminum, polysilicon, doped silicon and silicide.

It can be understood that, for the memory device, if each of the multiple memory cells is connected to a source electrode S of a respective transistor in the transistor array 20, each of the multiple bit lines BL is connected to drain electrodes D of transistors in a respective row of the transistor array 20 arranged in the second direction. Alternatively, if each of the multiple memory cells is connected to a drain electrode D of a respective transistor in the transistor array 20, each of the multiple bit lines BL is connected to source electrodes S of transistors in a respective row of the transistor array 20 arranged in the second direction.

In some embodiments, the memory device according to the present disclosure may be of various types, such as NAND flash memory, NOR flash memory, dynamic random access memory (DRAM), static random access memory (SRAM), phase-change memory (PCM), ferroelectric random access memory (FRAM), magnetic random access memory (MRAM) and resistive random access memory (RRAM).

In some embodiments, the memory device may include a DRAM. Each of the multiple memory cells includes a capacitor. The capacitor includes a second electrode having a columnar shape, dielectric covering sidewalls and a top surface of the second electrode, and a first electrode covering the dielectric. In practical application, the second electrode may be connected to the source electrode of a transistor in the transistor array. The first electrode may be connected to a reference voltage. The reference voltage may be a ground voltage, or may be other voltages. The capacitor is used to store the written data.

In some embodiments, the memory device may be a resistance random access memory, and each of the multiple memory cells may include an adjustable resistor. The adjustable resistor of each of the multiple memory cells is connected between a respective bit line of the multiple bit lines and a source electrode S of a respective transistor in the transistor array 20. Alternatively, the adjustable resistor of each of the multiple memory cells is connected between a respective bit line of the multiple bit lines and a drain electrode D of a respective transistor in the transistor array 20. The adjustable resistor of each of the multiple memory cells is used to regulate the state of the stored data by the bit line voltage provided by a respective bit line of the multiple bit lines.

It should be noted that only some common memory devices are exemplified herein, the scope of protection of the present disclosure is not limited thereto. Any memory device including the transistors according to embodiments of the present disclosure should be within the scope of protection of the present disclosure.

Figure 5:
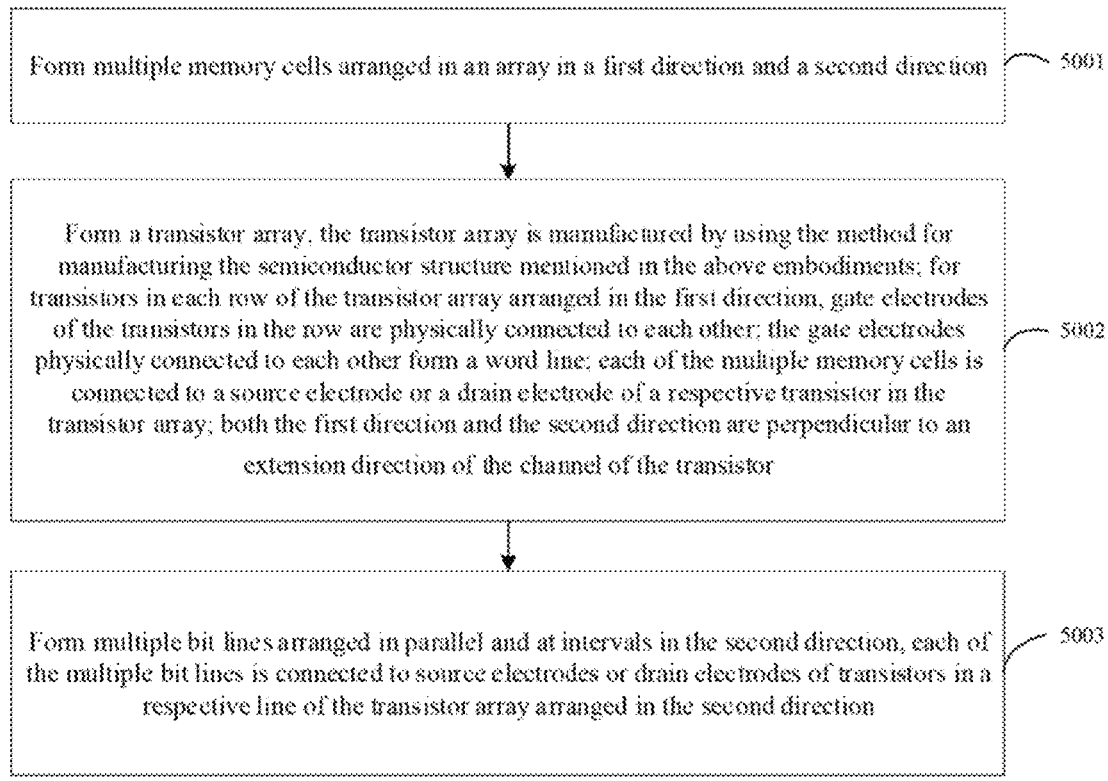
FIG. 5 is a flowchart of implementation of a method for manufacturing a semiconductor structure according to an embodiment of the present disclosure.
Figure 6:
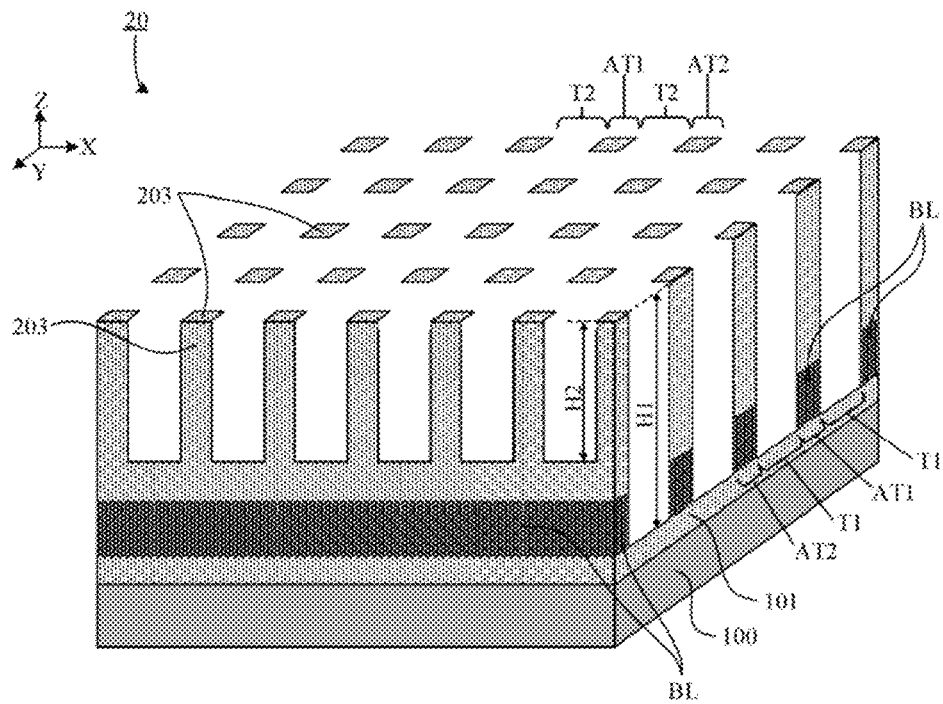
FIG. 6 is a three-dimensional diagram of a process of manufacturing a memory device according to an embodiment of the present disclosure.

FIG. 5 is a flowchart of implementation of a method for manufacturing a semiconductor structure according to an embodiment of the present disclosure. FIG. 6 is a three-dimensional diagram of a process of manufacturing a memory device according to an embodiment of the present disclosure.

The method for manufacturing the memory device according to the embodiments of the present disclosure will be described in detail with reference to FIG. 5 and FIG. 6. As illustrated in FIG. 5, in some embodiments, the method includes the following operations.

At block 5001, multiple memory cells (not shown in FIG. 6) arranged in an array in a first direction and a second direction are formed.

At block 5002, a transistor array 20 is formed. The transistor array 20 is manufactured by using the method for manufacturing the semiconductor structure described in the embodiments of the present disclosure. For transistors in each row of the transistor array 20 arranged in the first direction, gate electrodes 205 of the transistors in the row AT1/AT2 are physically connected to each other. The gate electrodes physically connected to each other form a word line. Each of the multiple memory cells is connected to a source electrode S or a drain electrode D of a respective transistor in the transistor array 20. Both the first direction and the second direction are perpendicular to an extension direction of the channel C of the transistor.

At block 5003, multiple bit lines arranged in parallel and at intervals in the second direction are formed. Each of the multiple bit lines is connected to source electrodes S or drain electrodes D of transistors in a respective line of the transistor array 20 arranged in the second direction.

The block 5001 is performed to form the multiple memory cells arranged in the array in the first direction and the second direction.

In some embodiments, each of the multiple memory cells includes a capacitor. The capacitor includes a first electrode, a dielectric layer and a second electrode. In practical application, the second electrode of the capacitor may be connected to a source electrode S of a transistor in the transistor array 20. The first electrode of the capacitor is grounded. The capacitor is used to store the written data.

The block 5002 is performed to have the transistor array 20. The transistor array 20 is manufactured by using the method for manufacturing the semiconductor structure described in the embodiments of the present disclosure. For transistors in each row of the transistor array 20 arranged in the first direction AT1/AT2, gate electrodes 205 of the transistors in the row AT1/AT2 are physically connected to each other. The gate electrodes physically connected to each other form a word line. Each of the multiple memory cells is connected to a source electrode S or a drain electrode D of a respective transistor in the transistor array 20. Both the first direction and the second direction are perpendicular to an extension direction of the channel C of the transistor.

In practical application, the materials of the gate oxide layer 204, the first dielectric layer 201, the gate isolation structure 207 and the second dielectric layer 206 are all insulating materials, and the materials of the gate oxide layer 204, the first dielectric layer 201, the gate isolation structure 207 and the second dielectric layer 206 may be the same or different.

The block 5003 is performed to have the multiple bit lines arranged in parallel and at intervals in the second direction. Each of the multiple bit lines BL is connected to the source electrodes S or the drain electrodes D of transistors in a respective line of the transistor array 20 arranged in the second direction.

In some embodiments, the multiple bit lines arranged in parallel in the second direction are formed. The multiple bit lines are buried bit lines. The method includes the following operations.

An active layer 101 is provided. Details can be found in the description of FIG. 3A, and will not be repeated herein.

The active layer 101 may be partially etched from the surface of the active layer. Multiple first trenches T1, which extend in the first direction and are arranged in parallel and at intervals in the second direction, are formed in the active layer 101. Multiple second trenches T2, which extend in the second direction and are arranged in parallel and at intervals in the first direction, are formed in the active layer 101. The multiple first trenches T1 have a first depth H1 in the extension direction of the channel C. and the multiple second trenches T2 have a second depth T2 in the extension direction of the channel C. The first depth H1 is larger than the second depth H2.

The alloying process can be used to metallize parts below the multiple first semiconductor layers 203 and located in the multiples first trenches T1 to form the bit lines illustrated in FIG. 6. The bit lines are located below the second trenches T2 in the third direction (It can be understood that the bit lines are located below the channels C), to form the buried bit lines. In the embodiment of the present disclosure, the material of the multiple bit lines may be a metal material or a semiconductor conductive material, such as copper, cobalt, tungsten, doped silicon, polysilicon, or any combination of copper, cobalt, tungsten, doped silicon and polysilicon.

The memory device manufactured by the method for manufacturing a memory device according to the embodiments of the present disclosure is similar to the memory device described in the above embodiment. The technical features not disclosed in detail in the embodiments of the present disclosure can be understood with reference to the above embodiments, and will not be described herein.

It should be understood that "an embodiment" or "the embodiment" mentioned throughout the description means that specific features, structures or characteristics related to the embodiments are included in at least one embodiment of the present disclosure. Therefore, "in an embodiment" or "in the embodiment" appearing throughout the description may not necessarily refer to the same embodiments. Furthermore, the specific features, structures or characteristics may be combined in any suitable manner in one or more embodiments. It should be understood that in various embodiments of the present disclosure, sequence numbers of the foregoing processes do not mean execution sequences. The execution sequences of the processes should be determined according to functions and internal logic of the processes, and should not be construed as any limitation on the implementation processes of the embodiments of the present disclosure. The above-mentioned numerals of the embodiments of the present disclosure are only for description, and do not represent the advantages and disadvantages of the embodiments.

The methods disclosed in the several method embodiments of the present disclosure can be arbitrarily combined without conflict to obtain a new method embodiment.

The foregoing description is merely a specific embodiment of the present disclosure, but the scope of protection of the present disclosure is not limited to this. Any change or replacement readily contemplated by those skilled in the art within the technical scope disclosed in the present disclosure shall fall within the scope of protection of the present disclosure. Accordingly, the scope of protection of the present disclosure shall be subject to the scope of protection of the claims.

In the embodiments of the present disclosure, the channel of each of the at least one transistor includes the semiconductor layer of a double-layered structure, and strain is introduced in the semiconductor layer of the double-layered structure. The introduced strain may elongate a distance between atoms in the semiconductor layer to reduce the number of atoms per unit length and reduce an amount of energy of carrier (electron/hole) migration, so that a carrier (electron/hole) mobility of the channel can be increased, thereby increasing a current speed of the channel, reducing power consumption of the transistor, increasing the speed of the transistor and the like. The transistor can thus have better performance.

What is claimed is:

1. A semiconductor structure, comprising a plurality of transistors, wherein each of the plurality of transistors comprises:
   a channel comprising a first semiconductor layer and a second semiconductor layer disposed around the first semiconductor layer, wherein the second semiconductor layer introduces strain into the channel;
   wherein a plurality of channels corresponding to the plurality of transistors are arranged in an array in a first direction and a second direction; and both the first direction and the second direction are perpendicular to the extension direction of the plurality of channels;

wherein a material of the first semiconductor layer comprises silicon germanium; and a material of the second semiconductor layer comprises silicon; and wherein the second semiconductor layer is located on sidewalls and a top surface of the first semiconductor layer.

2. The semiconductor structure of claim 1, wherein each of the plurality of transistors further comprises:

a gate electrode covering at least one sidewall of the channel; and a source electrode and a drain electrode, wherein each of the source electrode and the drain electrode is disposed on a respective end of an extension direction of the channel.

3. The semiconductor structure of claim 2, wherein the gate electrode is disposed around the channel.

4. The semiconductor structure of claim 1, wherein a lattice constant of a first element contained in the first semiconductor layer is different from a lattice constant of a second element contained in the second semiconductor layer.

5. The semiconductor structure of claim 1, wherein a cross-section of the channel is of a circular, an oval or a rectangle shape.

6. The semiconductor structure of claim 1, wherein the plurality of transistors are N-type transistors and the strain is tensile strain; or the plurality of transistors are P-type transistors and the strain is compressive strain.

7. A memory device comprising:

a plurality of memory cells arranged in an array in a first direction and a second direction;

a transistor array comprising multiple semiconductor structures of claim 1, wherein for transistors in each row of the transistor array arranged in the first direction, gate electrodes of the transistors in the row are physically connected to each other; the gate electrodes physically connected to each other form a word line; each of the plurality of memory cells is connected to a source electrode or a drain electrode of a respective transistor in the transistor array; and both the first direction and the second direction are perpendicular to an extension direction of the channel of the transistor; and a plurality of bit lines arranged in parallel and at intervals in the second direction, each of the plurality of bit lines being connected to source electrodes or drain electrodes of transistors in a respective line of the transistor array arranged in the second direction.

8. The memory device of claim 7, wherein the device memory comprises a Dynamic Random Access Memory (DRAM), a Ferroelectric Random Access Memory (FRAM), a Phase-Change Memory (PCM), a Magnetic Random Access Memory (MRAM), or a Resistive Random Access Memory (RRAM).

9. The memory device of claim 8, wherein the memory device comprises the DRAM; and each of the plurality of memory cells comprises a capacitor, wherein the capacitor comprises a second electrode having a columnar shape, a dielectric covering sidewalls and a top surface of the second electrode and a first electrode covering the dielectric.

10. A method for manufacturing a semiconductor structure, comprising:

forming a plurality of transistors; wherein each of the plurality of transistors corresponds to a respective one of a plurality of channels;

wherein forming the plurality of channels comprises:

providing an active layer;

partially etching the active layer to form a plurality of first trenches extending in a first direction, a plurality of second trenches extending in a second direction and a plurality of first semiconductor layers, each of the plurality of first semiconductor layers being located at a junction of a respective one of the plurality of first trenches and a respective one of the plurality of second trenches, wherein sidewalls of each of the plurality of first semiconductor layers are exposed in a respective one of the plurality of first trenches and a respective one of the plurality of second trenches, and extend in a direction perpendicular to a surface of the active layer, the first direction and the second direction being parallel to the surface of the active layer; and forming the second semiconductor layer on sidewalls and top surfaces of the plurality of first semiconductor layers;

wherein a material of the plurality of first semiconductor layers comprises silicon germanium; and a material of the second semiconductor layer comprises silicon; and wherein each of the plurality of channels comprises a respective one of the first semiconductor layers and the second semiconductor layer, wherein the second semiconductor layer introduces strain into each of the plurality of channels.

11. The method of claim 10, wherein the plurality of first trenches have a first depth in an extension direction of the plurality of channels and the plurality of second trenches have a second depth in the extension direction of the plurality of channels, the first depth being different from the second depth.

12. A method for manufacturing a memory device, comprising:

forming a plurality of memory cells arranged in an array in a first direction and a second direction;

forming a transistor array manufactured by using the method for manufacturing the semiconductor structure of claim 10, wherein for transistors in each row of the transistor array arranged in the first direction, gate electrodes of the transistors in the row are physically connected to each other; the gate electrodes physically connected to each other form a word line; each of the plurality of memory cells is connected to a source electrode or a drain electrode of a respective transistor in the transistor array; and both the first direction and the second direction are perpendicular to an extension direction of the channel of the transistor; and forming a plurality of bit lines arranged in parallel and at intervals in the second direction, each of the plurality of bit lines being connected to source electrodes or drain electrodes of transistors in a respective line of the transistor array arranged in the second direction.

* * * * *